United States Patent
Zhang et al.

(10) Patent No.: US 10,299,384 B2
(45) Date of Patent: May 21, 2019

(54) FLEXIBLE PRINTED CIRCUIT, CHIP ON FILM, AND BONDING METHOD AND DISPLAY DEVICE USING THE SAME

(71) Applicants: BOE Technology Group Co., Ltd., Beijing (CN); Beijing BOE Display Technology Co., Ltd., Beijing (CN)

(72) Inventors: Qiang Zhang, Beijing (CN); Bin Zhang, Beijing (CN); Dianzheng Dong, Beijing (CN); Guangxing Wang, Beijing (CN); Kan Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/527,530

(22) PCT Filed: Sep. 22, 2016

(86) PCT No.: PCT/CN2016/099700
§ 371 (c)(1),
(2) Date: May 17, 2017

(87) PCT Pub. No.: WO2017/063490
PCT Pub. Date: Apr. 20, 2017

(65) Prior Publication Data
US 2018/0007793 A1 Jan. 4, 2018

(30) Foreign Application Priority Data

Oct. 16, 2015 (CN) .......................... 2015 1 0673690

(51) Int. Cl.
*H05K 1/02* (2006.01)
*H05K 1/18* (2006.01)
*H05K 5/00* (2006.01)

(52) U.S. Cl.
CPC ............. *H05K 1/189* (2013.01); *H05K 1/028* (2013.01); *H05K 1/0269* (2013.01);
(Continued)

(58) Field of Classification Search
CPC ....... H05K 1/189; H05K 1/028; H05K 5/0017
See application file for complete search history.

(56) References Cited

U.S. PATENT DOCUMENTS 3,559,456 A * 2/1971 Lomker et al. ...... G01N 27/121
73/29.02
3,671,912 A * 6/1972 La Sota ............... G01N 27/121
200/61.04
(Continued)

FOREIGN PATENT DOCUMENTS

CN 101080121 A 11/2007
CN 102072906 A 5/2011
(Continued)

OTHER PUBLICATIONS

International Search Report and Written Opinion for International Application No. PCT/CN2016/099700, dated Dec. 27, 2016, 8 pages.

(Continued)

*Primary Examiner* — Nathan Milakovich
(74) *Attorney, Agent, or Firm* — Westman, Champlin & Koehler, P.A.

(57) ABSTRACT

This disclosure discloses a flexible printed circuit, a chip on film, and a bonding method and a display device using this flexible printed circuit and chip on film. The flexible printed circuit/chip on film of this disclosure comprises a humidity detection layer located between a flexible base film and a metal foil, wherein the humidity detection layer and the flexible base film, and/or the humidity detection layer and the metal foil, are optionally bonded by an adhesive layer. The humidity detection layer can change resistance and/or color according to the humidity, so that intuitive and rapid localization of coating defects is performed directly (by color change) or by means of a detecting lead and an
(Continued)

impedance/voltage detecting circuit, and finally the object of reducing the ratio of defective products is achieved.

16 Claims, 4 Drawing Sheets

(52) U.S. Cl.
CPC ... *H05K 5/0017* (2013.01); *H05K 2201/0145* (2013.01); *H05K 2201/0154* (2013.01); *H05K 2201/0323* (2013.01); *H05K 2201/10196* (2013.01); *H05K 2201/10681* (2013.01); *H05K 2203/161* (2013.01)

(56) References Cited

U.S. PATENT DOCUMENTS

| | | | |
|---|---|---|---|
| 4,680,220 A * | 7/1987 | Johnson | B32B 5/28 174/209 |
| 7,181,966 B2 * | 2/2007 | Isogai | G01N 27/223 326/105 |
| 2011/0011179 A1 * | 1/2011 | Gustafsson | G01N 27/223 73/335.03 |
| 2017/0038325 A1 * | 2/2017 | Takashima | G06K 19/0717 |

FOREIGN PATENT DOCUMENTS

| | | | |
|---|---|---|---|
| CN | 202121865 U | | 1/2012 |
| CN | 102072904 B | * | 6/2012 |
| CN | 105392272 A | | 3/2016 |
| JP | 2003-218503 A | | 7/2003 |

OTHER PUBLICATIONS

English translation of International Search Report and Written Opinion for International Application No. PCT/CN2016/099700, dated Dec. 27, 2016, 8 pages.

First Office Action from Chinese Patent Application No. 201510673690.1, dated Aug. 22, 2017, 10 pages.

Second Office Action for Chinese Patent Application No. 201510673690.1, dated Jan. 11, 2018, 8 pages.

\* cited by examiner

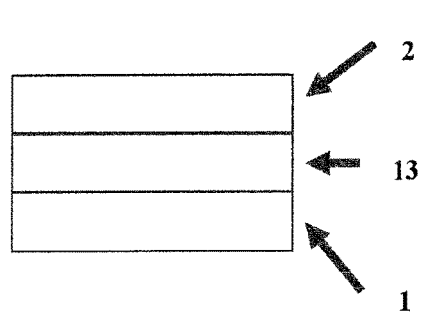
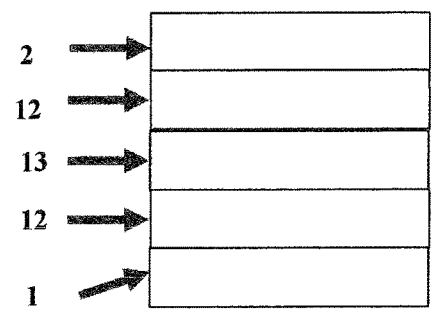
Fig. 3A                    Fig. 3B
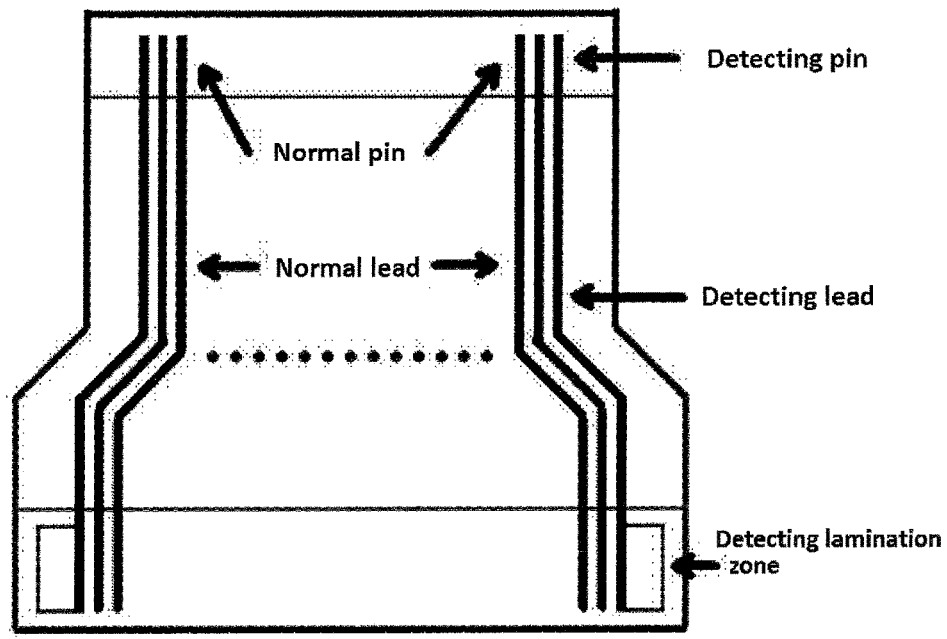
Fig. 4

→ Screen
→ Flexible printed circuit or chip on film
→ Driving circuit board

FLEXIBLE PRINTED CIRCUIT, CHIP ON FILM, AND BONDING METHOD AND DISPLAY DEVICE USING THE SAME

CROSS-REFERENCE TO RELATED APPLICATIONS

The present application is a Section 371 National Stage Application of International Application No. PCT/CN2016/099700, filed on 22 Sep. 2016, which published as WO 2017/063490 A1 on 20 Apr. 2017, and claims priority to Chinese Patent Application No. 201510673690.1 filed on Oct. 16, 2015, which are incorporated by reference herein in their entirety.

FIELD OF THE INVENTION

This disclosure relates to the field of display technology, and particularly to a new flexible printed circuit/chip on film, and a bonding method and a display device using this flexible printed circuit/chip on film.

BACKGROUND OF THE INVENTION

In the field of display, the flexible printed circuit (FPC) and the chip on film (COF) have been widely used for connecting screens and driving circuit boards.

A flexible printed circuit (FPC) is a printed circuit board having high reliability and excellent flexibility, which is produced by using a polyimide or polyester thin film as a base material. The flexible printed circuit has the characteristics of high wiring density, light weight, small thickness, and good bendability. A chip on film or chip on flex (COF) is a chip on film technique fixing a driving integrated circuit (IC) on a flexible wiring board, and is a technique for bonding a chip and a soft substrate circuit by using a soft additional circuit board as a packaging chip carrier. Simply, the difference between them is whether there is a driving IC fixed on FPC.

The mode for connecting a screen glass and a driving circuit board to a flexible printed circuit or a chip on film is a bonding process. In a practical process, an adhesive-type coating (such as an ultraviolet-curable adhesive (UV adhesive), etc.) may be typically added in a bonding zone in order to enhance the strength of connection and prevent the corrosion or short circuit of leads induced by water vapor intrusion.

Although this treatment may achieve the design object thereof to some extent, there is still a relatively large ratio of coating defects after coating an UV adhesive in view of the effect in practical use. This coating defects together with the mechanical damage in a later period and other reasons may result in decrease in mechanical strength. Particularly, there may be a risk of corrosion or short circuit of leads caused by water vapor intrusion. However, it is difficult to detect this risk based on the existing design, thereby resulting in a relatively high market risk of products.

SUMMARY OR THE INVENTION

An object of this disclosure is to provide a new flexible printed circuit, a chip on film, and a bonding method and a display device using the same, so as to solve the problem of the difficulty in the detection of coating defects in the prior art.

The object of this disclosure is achieved by the following technical solutions.

An embodiment of this disclosure provides a flexible printed circuit, comprising a humidity detection layer located between a flexible base film and a metal foil, wherein the humidity detection layer and the flexible base film, and/or the humidity detection layer and the metal foil, are optionally bonded by an adhesive layer.

An embodiment of this disclosure further provides a chip on film, comprising the flexible printed circuit described above and a driving integrated circuit fixed on the flexible printed circuit.

In the flexible printed circuit and the chip on film according to the embodiment described above, the humidity detection layer may comprise a hygroscopic film sheet, and the resistance value of the hygroscopic film sheet may change as the humidity changes. The hygroscopic film sheet may further have a color changeable material thereon, and the color of the color changeable material changes as the humidity changes.

An embodiment of this disclosure further provides a bonding method for connecting a screen and a driving circuit board, wherein the bonding method uses the flexible printed circuit or the chip on film described above to connect a screen and a driving circuit board.

In the bonding method according to the embodiment described above, a detecting lead may be used to be in electrical connection with a hygroscopic film sheet in the flexible printed circuit or the chip on film and to be in connection with an impedance/voltage detecting circuit in the driving circuit board.

An embodiment of this disclosure further provides a display device, wherein the display device comprises the flexible printed circuit or the chip on film described above for connecting a screen and a driving circuit board, or the display device is obtained by the bonding method described above.

The embodiments of this disclosure have the advantageous effect as follows. By adding a humidity detection layer in the structure of a flexible printed circuit or a chip on film, wherein the resistance and/or color of the humidity detection layer changes according to the change of the humidity, so that intuitive and rapid localization of coating defects is performed directly (by color change) or by means of a detecting lead and an impedance/voltage detecting circuit, and finally the object of reducing the ratio of defective products is achieved.

BRIEF DESCRIPTION OF THE DRAWINGS

FIG. 3A and FIG. 3B show the sectional views of COFs/FPCs according to the embodiments of this disclosure corresponding to FIG. 1A and FIG. 1B, respectively.

FIG. 4 shows a structural design of a detecting lead of this disclosure; and

DETAILED DESCRIPTION OF THE INVENTION

The processes for achieving embodiments of this disclosure are described below in detail in conjunction with the accompanying drawings. It is to be noted that the same or similar numerals represent the same or similar elements or elements having the same or similar functions throughout. The embodiments described below with reference to the accompanying drawings are exemplary and are merely used for explaining this disclosure, and it cannot be construed to be limitations of this disclosure.

Figure 1A:
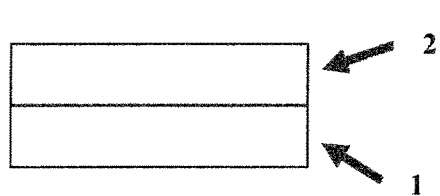
FIG. 1A and FIG. 1B show the sectional views of COFs/single-layer FPCs in the prior art with an adhesive layer and without an adhesive layer, respectively.
Figure 1B:
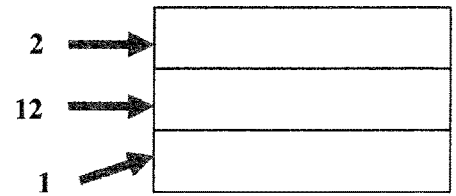

There are mainly two modes for connecting a screen glass to a driving circuit board in a display product, which are COF and FPC+COG (chip on glass). Those shown in FIG. 1 are the sectional views of COFs/single-layer FPCs in the prior art, wherein FIG. 1B is a conventional design and there is an adhesive layer between a flexible base film 1 and a metal foil (typically a copper foil) 2, FIG. 1A shows the latest design of COFs/single-layer FPC in which a metal foil 2 and a flexible base film 1 are directly laminated.

An FPC (Flexible Printed Circuit) is a printed circuit board having high reliability and excellent flexibility, which is produced by using a polyimide or polyester thin film as a base material. It has the characteristics of high wiring density, light weight, small thickness, and good bendability. In a conventional structure, a FPC is typically formed by laminating a soft plastic base film (PI) 1, a copper foil (Cu Copper) 2, and an adhesive 12 (as shown in FIG. 1B).

A COF (chip on film or chip on flex) is a chip on film technique fixing a driving integrated circuit (IC) on a flexible wiring board, and is a technique for bonding a chip and a soft substrate circuit by using a soft additional circuit board as a packaging chip carrier. The structure of COF is similar to that of the single-layer FPC, in which a layer of a metal foil 2 is added on a layer of a base film 1 (for example, a polyimide film). The difference between a COF and a FPC is the adhesive material at the junction, and a layer of an insulating coverlay should be added with respect to either of them. Therefore, the difference in the structures of them is at least two layers of adhesive. The copper foil used by the COF is approximately ⅓ oz, and therefore both the thickness and the flexibility of the COF are superior to those of the FPC.

Figure 2:
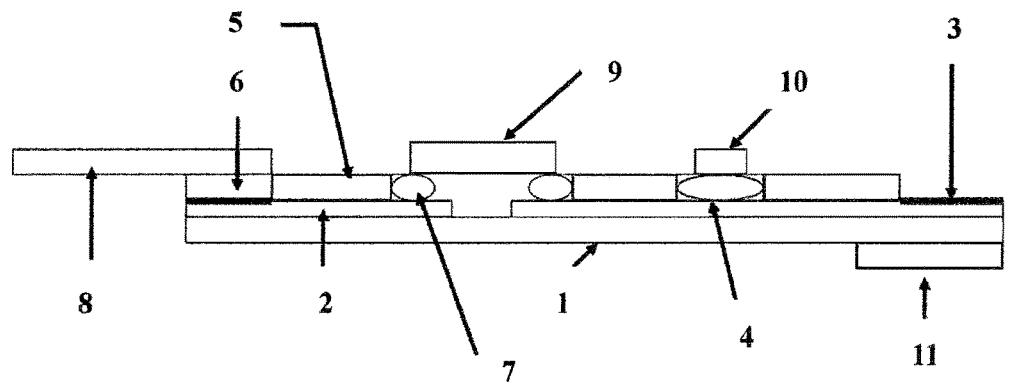
FIG. 2 is a schematic diagram of a complete module using a COF package.

FIG. 2 is a schematic diagram of a complete module using a COF package. Since a COF film is usually in a form of 2 layers at present, the bondings of this film to respective components of a panel, a printed circuit board (PCB), and an integrated circuit (IC) are all in the same side.

The meanings of the reference numerals in FIG. 2 are as follows: 1. a base film (for example, a polyimide film); 2. a metal foil (for example, a copper foil); 3. a plating layer; 4. a solder; 5. a solder mask; 6. ACF (an anisotropic conductive film); 7. a gold bump; 8. a liquid crystal display (LCD); 9. an integrated circuit chip (IC Chip); 10. a sheet-like resistor chip; 11. a reinforce board. Here, ACFs (anisotropic conductive films) are used as median in all of the bondings of the COF film to the panel and the IC to allow respective parts to be conducted. However, with respect to the selection of the ACF, ACFs having different adhesive properties and conductive particles with different sizes are selected due to the different substances and distances of bondings.

In an existing bonding process, an adhesive-type coating (such as an UV adhesive, etc.) may be typically added in a bonding zone in order to enhance the strength of connection and prevent corrosion or short circuit of leads induced by water vapor intrusion. However, there is still a relatively large ratio of coating defects after coating an UV adhesive. This coating defects together with mechanical damage in a later period and other reasons may result in decrease in mechanical strength. Particularly, there may be a risk of corrosion or short circuit of leads caused by water vapor intrusion. However, it is difficult to detect this risk based on an existing design, thereby resulting in a relatively high market risk of products.

An embodiment of this disclosure provides a new flexible printed circuit or chip on film, wherein a humidity detection layer is added between a flexible base film and a metal foil. FIG. 3 is a sectional view of a flexible printed circuit or chip on film according to an embodiment of this disclosure. Compared to the flexible printed circuit or chip on film shown in FIG. 1A and FIG. 1B, a humidity detection layer 13 is added between a flexible base film 1 and a metal foil 2 in a flexible printed circuit or chip on film in an embodiment of this disclosure. The detection of humidity change is achieved by this humidity detection layer so as to perform intuitive and rapid localization of coating defects.

In a flexible printed circuit or chip on film according to an embodiment of this disclosure, the flexible base film is a flexible base film commonly used in the art. For example, as for a FPC, the flexible base film may comprise a polyimide thin film, a polyester thin film, etc.; and as for a COF, the flexible base film may comprise a polyimide thin film, etc. The metal foil may be a metal foil commonly used in a flexible printed circuit or chip on film in the art, for example a copper foil, or a transparent conductive wire material layer such as an ITO layer, etc.

In a flexible printed circuit or chip on film according to an embodiment of this disclosure, the humidity detection layer comprises a hygroscopic film sheet, and the resistance value of the hygroscopic film sheet may change as the humidity changes. As such a hygroscopic film sheet, a carbon film hygristor and a lithium chloride humidity sheet may be used. As for the former one, a high-molecular polymer and a conductive material carbon black are formulated with an adhesive at a certain ratio to form an adhesive-like liquid, which is coated onto a substrate to form a resistor sheet; and as for the latter one, a layer of an alcohol solution of lithium chloride is coated on a substrate, the concentration of the solution of lithium chloride changes as the air humidity changes so as to change the resistance of the humidity-measuring film sheet.

The humidity detection layer described above may further comprise a color changeable material located above the hygroscopic film sheet, and the color of the color changeable material changes as the humidity changes. The introduction of a color changeable material responding to humidity may achieve intuitive observation of humidity change caused by water vapor intrusion. As a color changeable material responding to humidity, a color changeable silica gel, anhydrous copper sulfate, or the like may be used. In order to facilitate observation, the color changeable material responding to humidity may be uniformly distributed on the hygroscopic film sheet in a dot-like or net-like form.

According to an embodiment of this disclosure, the size of the humidity detection layer may be determined according to specific applications. For example, the size of the humidity detection layer may be substantially the same as that of the base film, i.e., reaching the edge of an element such as a flexible printed circuit or a chip on film. In this case, since the humidity detection layer is sensitive to humidity, it is to be noted that an environment having a relatively high humidity needs to be prevented in processes of packaging and assembly of elements. In order to prevent the effect of a relatively high humidity on the humidity detection layer in processes of packaging and assembly, preferably, the size of the humidity detection layer is smaller and an insulation frame is provided at the edge thereof. The insulation frame has an effect of blocking moisture to achieve the protection of the humidity detection layer. Preferably, the insulation frame may be melted and decomposed at a relatively high temperature upon bonding, so that the function of detection may be better achieved. The material of this insulation frame may comprise, for example, wax, etc.

According to an embodiment of this disclosure, the thickness of the humidity detection layer is in a range of 3-30 µm, preferably about 15 µm. When the thickness of the humidity detection layer is in the range described above, the technical effect of this disclosure may be better achieved.

In a flexible printed circuit or chip on film according to an embodiment of this disclosure, a detecting lead in electrical connection with the hygroscopic film sheet may be further comprised. The detecting lead in electrical connection with the hygroscopic film sheet is used to be in connection with a detecting circuit and detect the change of the resistance/voltage of the hygroscopic film sheet with humidity.

FIG. 4 shows a structural design of a detecting lead of this disclosure, and the structural characteristic thereof is that electrical connection is achieved by laminating the detecting lead to the hygroscopic film sheet via a conductive adhesive. Typically, in addition to the original design of leads, two more detecting leads are required to be added as 1 set of hygroscopic film sheet detecting zones is added. As shown in FIG. 4, the structural design of the detecting lead is symmetrical. That is, a detecting lead is added at each of the left and right outermost sides of a normal lead, and the detecting lead is connected to the hygroscopic film sheet through a detecting lamination zone. The detecting lead may be connected to a driving circuit board, and a function of impedance detection upon humidity change is achieved by adding an impedance (voltage) detecting circuit in the driving circuit board. The significant electrical connecting between a detecting lead and a hygroscopic film sheet may be achieved in a simple mode as follows. A conductive adhesive having the same thickness is used in the connection zone between a hygroscopic film sheet and a detecting lead to replace a nonconductive adhesive and is laminated to achieve the electrical connection thereof, so that the object of detection is achieved.

Furthermore, in an embodiment of this disclosure, if the humidity detection layer has smaller impedance, an insulating layer may be provided between the humidity detection layer and the metal foil layer. As the material of the insulating layer, an insulating adhesive or other materials having a good insulating property may be used so as to achieve a better electrical insulation effect. At the meanwhile, in order to achieve the detection of the resistance/voltage of the humidity detection layer, a conductive layer is required to be provided between a humidity detection layer and a metal foil at a position corresponding to the detecting lead.

Figure 5:
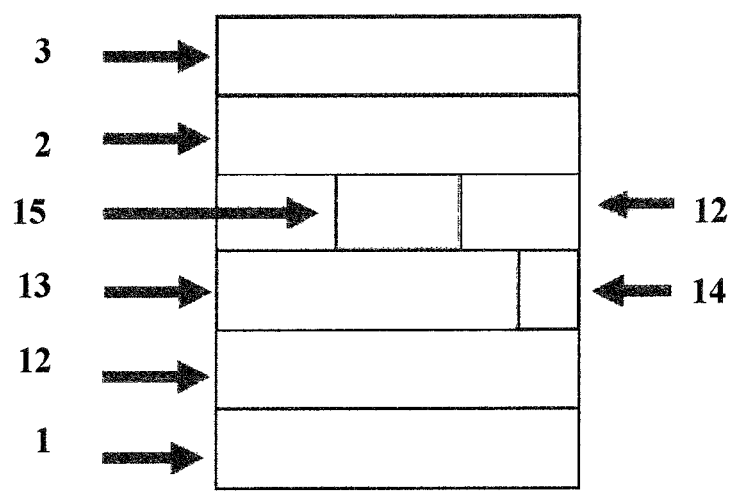
FIG. 5 is a sectional view of a complete structure of a COF/FPC in an embodiment of this disclosure.

FIG. 5 shows a sectional view of a complete structure of an embodiment of this disclosure. Those in FIG. 5 are a base film 1, an adhesive layer 12, a humidity detection layer 13/an insulation frame 14, an adhesive layer 12/a conductive layer 15, a metal foil 2, and a plating layer 3 in this order from the bottom to the top. Here, the adhesive layer 12 between the humidity detection layer 13 and the base film 1 and/or, the adhesive layer 12 between the humidity detection layer 13 and the metal foil 2, may be absent. In the case where the adhesive layer 12 between the humidity detection layer 13 and the metal foil 2 is an insulating layer, a conductive layer 15 is provided between the humidity detection layer 13 and the metal foil 2 at a position corresponding to the detecting lead. The plating layer 3 on the metal foil 2 is used to prevent the metal foil (for example, a copper foil) from being oxidized. However, this plating layer is unnecessary.

The embodiment of this disclosure has the advantageous effects as follows. By adding a humidity detection layer in the structure of a flexible printed circuit or a chip on film, wherein the resistance and/or color of the humidity detection layer changes according to the change of the humidity, so that intuitive and rapid localization of coating defects is performed directly (by color change) or by means of a detecting lead and an impedance/voltage detecting circuit, and finally the object of reducing the ratio of defective products is achieved.

Figure 6:
FIG. 6 shows a bonding method for connecting a screen and a driving circuit board, wherein the bonding method uses a flexible printed circuit or a chip on film to connect the screen and the driving circuit board.

Another embodiment of this disclosure provides a bonding method for connecting a screen and a driving circuit board, wherein the bonding method uses the flexible printed circuit or the chip on film in embodiment 1 of this disclosure to connect a screen and a driving circuit board as illustrated in FIG. 6.

On the basis of the prior art, the bonding method of this embodiment uses the flexible printed circuit or the chip on film described above in the embodiments of this disclosure. That is, a detecting lead is added to the original structure. The detecting lead is used to be in electrical connection with a hygroscopic film sheet in the flexible printed circuit or the chip on film, and furthermore to be in connection with an impedance/voltage detecting circuit in the driving circuit board. Therefore, the detection of humidity change is achieved by detecting the change of the impedance/voltage of the hygroscopic film sheet in the humidity detection layer, so as to perform intuitive and rapid localization of coating defects.

The embodiment of this disclosure has the advantageous effects as follows. By connecting a screen and a driving circuit board using a flexible printed circuit or a chip on film having a humidity detection layer, wherein the resistance and/or color of the humidity detection layer changes according to the change of the humidity, so that intuitive and rapid localization of coating defects in the process of bonding is performed, and finally the object of reducing the ratio of defective products is achieved.

Another embodiment of this disclosure provides a display device, wherein the display device comprises the flexible printed circuit or the chip on film in the embodiments of this disclosure for connecting a screen and a driving circuit board, or the display device is obtained by the bonding method in the embodiments of this disclosure.

The embodiment of this disclosure has the advantageous effects as follows. The flexible printed circuit or the chip on film comprised in the display device has a humidity detection layer, wherein the resistance and/or color of the humidity detection layer changes according to the change of the humidity, so that intuitive and rapid localization of coating defects may be performed, and finally the object of reducing the ratio of defective products is achieved.

Obviously, the person skilled in the art may perform various modifications and variations on this disclosure without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A flexible printed circuit, comprising a humidity detection layer located between a flexible base film and a metal foil, wherein the humidity detection layer and the flexible base film are optionally bonded by an adhesive layer, the humidity detection layer and the metal foil are contacted directly, the flexible base film is a polyimide film or a polyester film, the humidity detection layer comprises a hygroscopic film sheet, and the hygroscopic film sheet comprises a carbon film hygristor and a lithium chloride humidity sheet.

2. The flexible printed circuit according to claim 1, wherein the humidity detection layer further comprises a color changeable material located above the hygroscopic film sheet, and a color of the color changeable material changes as a humidity changes.

3. The flexible printed circuit according to claim 2, wherein the color changeable material comprises color changeable silica gel and anhydrous copper sulfate.

4. The flexible printed circuit according to claim 2, wherein the color changeable material is distributed on the hygroscopic film sheet in a dot-like or net-like form.

5. The flexible printed circuit according to claim 1, wherein an insulation frame is provided at an edge of the humidity detection layer.

6. The flexible printed circuit according to claim 5, wherein the insulation frame is melted or decomposed upon bonding.

7. The flexible printed circuit according to claim 1, further comprising a detecting lead in electrical connection with the hygroscopic film sheet.

8. The flexible printed circuit according to claim 7, wherein the electrical connection is achieved by laminating the detecting lead to the hygroscopic film sheet via a conductive adhesive.

9. The flexible printed circuit according to claim 1, further comprising a plating layer on a side of the metal foil opposite to the humidity detection layer.

10. The flexible printed circuit according to claim 1, wherein the humidity detection layer has a thickness of 3-30 µm.

11. A chip on film, comprising the flexible printed circuit as claimed in claim 1 and a driving integrated circuit fixed on the flexible printed circuit.

12. A bonding method for connecting a screen and a driving circuit board, wherein the flexible printed circuit as claimed in claim 1 is used to connect a screen and a driving circuit board.

13. The bonding method according to claim 12, wherein a detecting lead is used to be in electrical connection with the hygroscopic film sheet in the flexible printed circuit and to be in connection with an impedance/voltage detecting circuit in the driving circuit board.

14. A display device, comprising the flexible printed circuit as claimed in claim 1 for connecting a screen and a driving circuit board.

15. A bonding method for connecting a screen and a driving circuit board, wherein the chip on film as claimed in claim 11 is used to connect a screen and a driving circuit board.

16. A display device comprising the chip on film as claimed in claim 11 for connecting a screen and a driving circuit board.

* * * * *